US009859679B2

(12) United States Patent
Kimura

(10) Patent No.: US 9,859,679 B2
(45) Date of Patent: Jan. 2, 2018

(54) SEMICONDUCTOR LASER MODULE AND METHOD OF MANUFACTURING THE SAME

(71) Applicant: FUJIKURA LTD., Tokyo (JP)

(72) Inventor: Naoki Kimura, Sakura (JP)

(73) Assignee: FUJIKURA LTD., Tokyo (JP)

( * ) Notice: Subject to any disclaimer, the term of this patent is extended or adjusted under 35 U.S.C. 154(b) by 39 days.

(21) Appl. No.: 14/825,416

(22) Filed: Aug. 13, 2015

(65) Prior Publication Data

US 2015/0349488 A1 Dec. 3, 2015

Related U.S. Application Data

(63) Continuation of application No. PCT/JP2014/055238, filed on Mar. 3, 2014.

(30) Foreign Application Priority Data

Mar. 5, 2013 (JP) ................................. 2013-043014

(51) Int. Cl.
*G02B 27/30* (2006.01)
*H01S 5/022* (2006.01)
*H01S 5/00* (2006.01)

(52) U.S. Cl.
CPC .......... *H01S 5/02252* (2013.01); *G02B 27/30* (2013.01); *H01S 5/02256* (2013.01); *H01S 5/02288* (2013.01); *H01S 5/005* (2013.01); *Y10T 29/49131* (2015.01)

(58) Field of Classification Search
CPC ................................................ H01S 5/02252
USPC ......................................................... 359/641
See application file for complete search history.

(56) References Cited

U.S. PATENT DOCUMENTS

| 5,758,950 A | 6/1998 | Naoe et al. |
| 5,793,792 A | 8/1998 | Baxter et al. |
| 6,985,506 B2 | 1/2006 | Lissotschenko |
| 7,539,233 B2 | 5/2009 | Teramura et al. |
| 2004/0218636 A1 | 11/2004 | Kashima et al. |

(Continued)

FOREIGN PATENT DOCUMENTS

| CN | 102687050 A | 9/2012 |
| JP | 4-131810 A | 5/1992 |

(Continued)

OTHER PUBLICATIONS

International Search Report dated Apr. 28, 2014, issued in counterpart Application No. PCT/JP2014/055238 (2 pages).

(Continued)

*Primary Examiner* — James Jones
(74) *Attorney, Agent, or Firm* — Westerman, Hattori, Daniels & Adrian, LLP

(57) ABSTRACT

A semiconductor laser module 1 has a semiconductor laser device 30 operable to emit a laser beam L having an optical axis along the Z-direction, a collimator lens 40 configured to collimate components of the laser beam L along a direction of a fast axis (Y-direction), and a lens fixture block 50 fixed relative to the semiconductor laser device 30. The lens fixture block 50 has a lens attachment surface 50A perpendicular to the X-direction. An end 40A of the collimator lens 40 along the X-direction is fixed to the lens attachment surface 50A of the lens fixture block 50 with a lens fixation resin 42.

12 Claims, 5 Drawing Sheets

(56) References Cited

U.S. PATENT DOCUMENTS

| | | | |
|---|---|---|---|
| 2005/0002615 A1 | 1/2005 | Azimi et al. | |
| 2005/0147149 A1 | 7/2005 | Fuse | |
| 2006/0222042 A1* | 10/2006 | Teramura | G02B 7/025 |
| | | | 372/101 |
| 2010/0053414 A1 | 3/2010 | Tamaki et al. | |
| 2012/0275747 A1 | 11/2012 | Kimura et al. | |
| 2012/0294326 A1 | 11/2012 | Seibert | |

FOREIGN PATENT DOCUMENTS

| | | |
|---|---|---|
| JP | 07-140361 A | 6/1995 |
| JP | 08-5876 A | 1/1996 |
| JP | 9-246658 A | 9/1997 |
| JP | H09-246657 A | 9/1997 |
| JP | 3423723 B | 7/2003 |
| JP | 2004-200634 A | 7/2004 |
| JP | 2005-243659 A | 9/2005 |
| JP | 2006-59934 A | 3/2006 |
| JP | 2006-284851 A | 10/2006 |
| JP | 2007-219337 A | 8/2007 |
| JP | 2010-232370 A | 10/2010 |
| WO | 96/38749 A1 | 12/1996 |
| WO | 2009/087974 A1 | 7/2009 |

OTHER PUBLICATIONS

Extended European Search Report dated Mar. 6, 2017, issued in counterpart European Application No. 14760947.3. (8 pages).

Office Action dated Apr. 27, 2017, issued in counterpart Chinese Application No. 201480010448.0, with English translation. (22 pages).

* cited by examiner

SEMICONDUCTOR LASER MODULE AND METHOD OF MANUFACTURING THE SAME

TECHNICAL FIELD

The present invention relates to a semiconductor laser module and a method of manufacturing the same. More particularly, the present invention relates to a semiconductor laser module including a semiconductor laser device and a collimator lens for collimating a laser beam emitted from the semiconductor laser device and to a method of manufacturing such a semiconductor laser module.

BACKGROUND ART

Generally, a direction perpendicular to a p-n junction of a semiconductor laser device is referred to as a fast axis, whereas a direction in parallel to the p-n junction is referred to as a slow axis. A numerical aperture of a semiconductor laser device in a direction along its fast axis is much greater than that in a direction along its slow axis. Therefore, a laser beam emitted from a semiconductor laser device greatly spreads in a direction along its fast axis. Accordingly, a collimator lens for collimating fast-axis components of a laser beam emitted from a semiconductor laser device should be arranged near an emitting surface of the semiconductor laser device (see e.g., Patent Literature 1 and Patent Literature 2).

In order to arrange a desired optical system using such a collimator lens, it is necessary to fix the collimator lens highly precisely relative to a semiconductor laser device in a direction parallel to an optical axis and a direction parallel to a fast axis and to prevent variations in positional relationship between the semiconductor laser device and the collimator lens. Specifically, the positional relationship between the semiconductor laser device and the collimator lens should be fixed and maintained in the micron order.

For example, in an optical fiber attachment apparatus disclosed in FIG. 4 of Patent Literature 1, a collimator lens (optical fiber lens 26) is attached so that it can slide along its axis. In order to attach the optical fiber lens 26 in a slidable manner, a certain clearance needs to be formed between a cylindrical clamp 52 and the optical fiber lens 26. Therefore, variation in position of the optical fiber lens 26 cannot be reduced in the micron order in both of a direction of an optical axis of a laser beam emitted from a semiconductor laser device bar 10 and a direction along a fast axis.

Furthermore, the optical fiber lens 26 of Patent Literature 1 is fixed to an attachment member 40 with an epoxy resin 50. The optical fiber lens 26 is deviated in the direction of the optical axis of the laser beam by shrinkage of the epoxy resin 50 on curing. Moreover, since the optical fiber lens 26 is fixed directly to the attachment member 40 with the epoxy resin 50, the amount of the epoxy resin 50 that is not less than required for alignment needs to be provided between the attachment member 40 and the optical fiber lens 26 in order to conduct alignment of the optical fiber lens 26. The optical fiber lens 26 is also deviated in a direction along its fast axis by shrinkage or expansion of the epoxy resin 50 due to a temperature change or a humidity change.

Furthermore, Patent Literature 2 discloses a semiconductor laser module in which a semiconductor laser device 1 and a collimator lens 6 are fixed to one supplementary member 4 with brazing layers 5 and 8, respectively, to reduce variations in positional relationship between the semiconductor laser device 1 and the collimator lens 6 in cooperation with deflection of the semiconductor laser device 1 and deflection of the collimator lens 6. When the position of the semiconductor laser device 1 is adjusted, the semiconductor laser device 1 needs to be positioned at a high temperature of, for example, about 400° C. in order to braze the brazing layers 5 and 8. However, a laser beam cannot be emitted from the semiconductor laser device 1 at such a high temperature. Thus, there is a problem that the collimator lens 6 cannot be aligned while a laser beam is emitted from the semiconductor laser device 1 (what is called active alignment cannot be performed).

In this case, active alignment can be performed if the semiconductor laser device 1 and the collimator lens 6 are fixed with a resin or the like instead of the brazing layers 5 and 8. In such a case, however, the position of the supplementary member 4 and the collimator lens 6 greatly varies relative to the semiconductor laser device 1 due to shrinkage or expansion of the resin. Accordingly there is a problem that the collimator lens 6 is deviated from the aligned position.

PRIOR ART LITERATURE

Patent Literature
  Patent Literature 1: JP 2004-200634 A
  Patent Literature 2: JP 3423723 B

SUMMARY OF INVENTION

Problem(s) to be Solved by the Invention

The present invention has been made in view of the above drawbacks in the prior art. It is, therefore, a first object of the present invention to provide a semiconductor laser module capable of reducing influence from shrinkage or expansion of a resin for fixing a collimator lens and of holding the collimator lens in a highly precisely aligned state.

Furthermore, a second object of the present invention is to provide a method of manufacturing a semiconductor laser module that can fix a collimator lens with high precision relative to a semiconductor laser device while active alignment of the collimator lens is performed.

Means for Solving Problem(s)

According to a first aspect of the present invention, there is provided a semiconductor laser module capable of reducing influence from shrinkage or expansion of a resin for fixing a collimator lens and of holding the collimator lens in a highly precisely aligned state. The semiconductor laser module has a semiconductor laser device operable to emit a laser beam having an optical axis along a first direction, a collimator lens configured to collimate a component of the laser beam emitted from the semiconductor laser device along a second direction perpendicular to the first direction, and a lens fixture block fixed relative to the semiconductor laser device. The lens fixture block has a lens attachment surface perpendicular to a third direction that is perpendicular to the first direction and the second direction. At least one of ends of the collimator lens along the third direction is fixed to the lens attachment surface of the lens fixture block with a lens fixation resin.

Thus, according to the first aspect of the present invention, the lens fixation resin for fixing the collimator lens is provided between the end of the collimator lens along the third direction and the lens attachment surface perpendicular to the third direction. Therefore, shrinkage of the lens fixation resin on curing or shrinkage or expansion of the lens fixation resin due to a temperature change or a humidity change primarily causes the position of the collimator lens to vary only in the third direction. Furthermore, the position of the collimator lens does not need to be adjusted in the third direction. Thus, in terms of optics, the collimator lens may be located at any position in the third direction. Therefore, the thickness of the lens fixation resin between the collimator lens and the lens attachment surface can be reduced so as to reduce the amount of variation of the lens fixation resin per se due to shrinkage or expansion of the lens fixation resin. Accordingly the collimator lens hardly changes its position in the first direction or the second direction. As a result, influence from shrinkage or expansion of the lens fixation resin for fixing the collimator lens can be reduced. Thus, the collimator lens can be held in a highly precisely aligned state.

The second direction may be a direction along a fast axis of the laser beam emitted from the semiconductor laser device. Furthermore, a UV-curable resin or a thermosetting resin may be used as the lens fixation resin. Moreover, it is preferable to fix the semiconductor laser device and the lens fixture block to the same substrate. A spacer may be disposed between the substrate and the semiconductor laser device.

Preferably an equal amount of the lens fixation resin is present on opposite sides of the collimator lens along the first direction. With this configuration, the lens fixation resin equally shrinks or expands on the opposite sides of the collimator lens along the first direction so that the shrinkage or expansion is cancelled out on the opposite sides of the collimator lens along the first direction. Accordingly shrinkage or expansion of the lens fixation resin exerts substantially no influence on the collimator lens along the first direction. Similarly, an equal amount of the lens fixation resin is preferably present on opposite sides of the collimator lens along the second direction. With this configuration, the lens fixation resin equally shrinks or expands on the opposite sides of the collimator lens along the second direction so that the shrinkage or expansion is cancelled out on the opposite sides of the collimator lens along the second direction. Accordingly shrinkage or expansion of the lens fixation resin exerts substantially no influence on the collimator lens along the second direction.

Furthermore, if the thickness of the block fixation resin between the lens fixture block and the substrate is more than 20 μm, then the lens fixture block and the collimator lens fixed to the lens fixture block are moved in the second direction because of shrinkage or expansion of the block fixation resin due to a temperature change or a humidity change. In such a case, an optical path of the laser beam emitted from the collimator lens is deviated so as to cause some adverse influence. Accordingly it is preferable to fix the lens fixture block to the substrate with the block fixation resin having a thickness of not more than 20 μm.

According to a second aspect of the present invention, there is provided a method of manufacturing a semiconductor laser module that can fix a collimator lens with high precision relative to a semiconductor laser device while active alignment of the collimator lens is performed. This manufacturing method produces a semiconductor laser module having a semiconductor laser device operable to emit a laser beam having an optical axis along a first direction and a collimator lens configured to collimate a component of the laser beam emitted from the semiconductor laser device along a second direction perpendicular to the first direction. In this manufacturing method, the semiconductor laser device is fixed relative to a substrate, and a lens fixture block having a lens attachment surface is fixed to the substrate so that the lens attachment surface is perpendicular to a third direction that is perpendicular to the first direction and the second direction. A lens fixation resin is applied to the lens attachment surface of the lens fixture block, and an end of the collimator lens along the third direction is inserted into the lens fixation resin applied to the lens attachment surface. The collimator lens inserted in the lens fixation resin is positioned into a desired location while a laser beam is emitted from the semiconductor laser device. When the collimator lens has been positioned, the lens fixation resin is hardened to fix the collimator lens to the lens fixture block.

Thus, according to the second aspect of the present invention, the collimator lens is fixed to the lens fixture block with the lens fixation resin. Therefore, this method does not require to hold an atmosphere at a high temperature, unlike solder jointing disclosed in Patent Literature 2. Accordingly, the collimator lens can be positioned in place while a laser beam is emitted from the semiconductor laser device (active alignment). Additionally, the lens fixation resin is provided between the end of the collimator lens along the third direction and the lens attachment surface perpendicular to the third direction. Therefore, shrinkage of the lens fixation resin on curing or shrinkage or expansion of the lens fixation resin due to a temperature change or a humidity change primarily causes the position of the collimator lens to vary only in the third direction. Furthermore, the position of the collimator lens does not need to be adjusted in the third direction. Thus, in terms of optics, the collimator lens may be located at any position in the third direction. Therefore, the thickness of the lens fixation resin between the collimator lens and the lens attachment surface can be reduced so as to reduce the amount of variation of the lens fixation resin per se due to shrinkage or expansion of the lens fixation resin. Accordingly, the collimator lens hardly changes its position in the first direction or the second direction. As a result, the collimator lens can be fixed to the semiconductor laser device with high precision.

The second direction may be a direction along a fast axis of the laser beam emitted from the semiconductor laser device. Furthermore, a UV-curable resin or a thermosetting resin may be used as the lens fixation resin. A spacer may be disposed between the substrate and the semiconductor laser device.

Furthermore, it is preferable to insert the end of the collimator lens into the lens fixation resin such that an equal amount of the lens fixation resin is present on opposite sides of the collimator lens along the first direction. With this configuration, the lens fixation resin equally shrinks or expands on the opposite sides of the collimator lens along the first direction so that the shrinkage or expansion is cancelled out on the opposite sides of the collimator lens along the first direction. Accordingly, shrinkage or expansion of the lens fixation resin exerts substantially no influence on the collimator lens along the first direction. Similarly, it is preferable to insert the end of the collimator lens into the lens fixation resin such that an equal amount of lens fixation resin is present on opposite side of the collimator lens along the second direction. With this configuration, the lens fixation resin equally shrinks or expands on the opposite sides of the collimator lens along the second direction so that the shrinkage or expansion is cancelled out on the opposite sides of the collimator lens along the second direction. Accordingly, shrinkage or expansion of the lens fixation resin exerts substantially no influence on the collimator lens along the second direction.

Furthermore, if the thickness of the block fixation resin between the lens fixture block and the substrate is more than 20 μm, then the lens fixture block and the collimator lens fixed to the lens fixture block are moved in the second direction because of shrinkage or expansion of the block fixation resin due to a temperature change or a humidity change. Accordingly when the lens fixture block is fixed to the substrate, it is preferable to apply a block fixation resin between the lens fixture block and the substrate, and to harden the block fixation resin to fix the lens fixture block to the substrate while the lens fixture block is pressed against the substrate such that the block fixation resin has a thickness of not more than 20 μm between the lens fixture block and the substrate.

Advantageous Effects of the Invention

According to the present invention, there can be provided as semiconductor laser module capable of reducing influence from shrinkage or expansion of a resin for fixing a collimator lens and of holding the collimator lens in a highly precisely aligned state. Furthermore, according to the present invention, there can be provided a method of manufacturing a semiconductor laser module that can fix a collimator lens with high precision relative to a semiconductor laser device while active alignment of the collimator lens is performed.

MODE(S) FOR CARRYING OUT THE INVENTION

Figure 1:
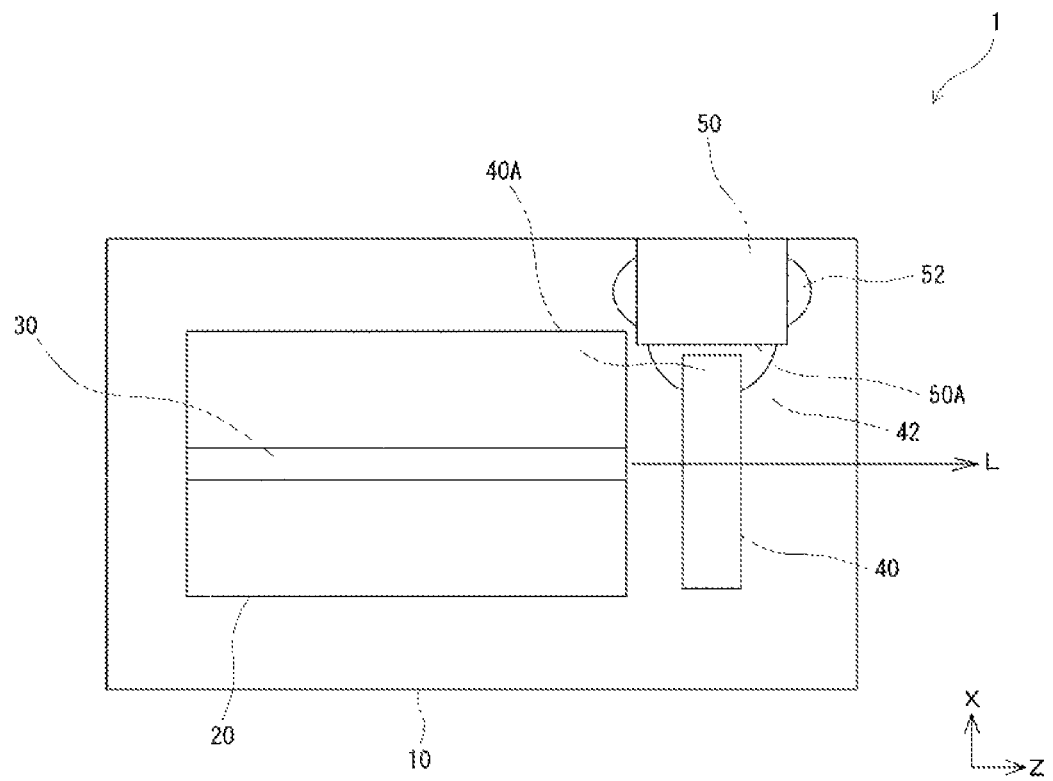
FIG. 1 is a plan view showing a semiconductor laser module according to a first embodiment of the present invention.

Embodiments of a semiconductor laser module according to the present invention will be described in detail below with reference to FIGS. 1 to 9. The same or corresponding components are denoted by the same reference numerals in FIGS. 1 to 9 so as to avoid redundant explanation.

Figure 2:
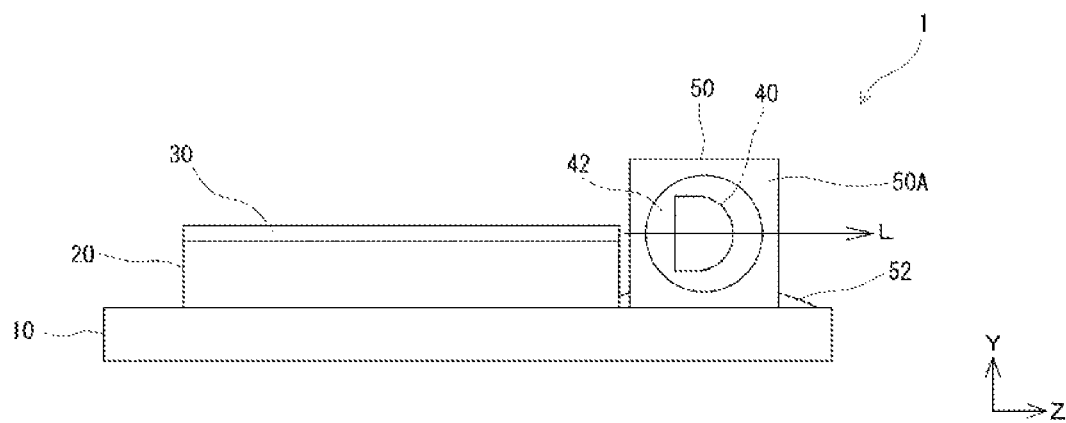
FIG. 2 is a front view of the semiconductor laser module shown in FIG. 1.
Figure 3:
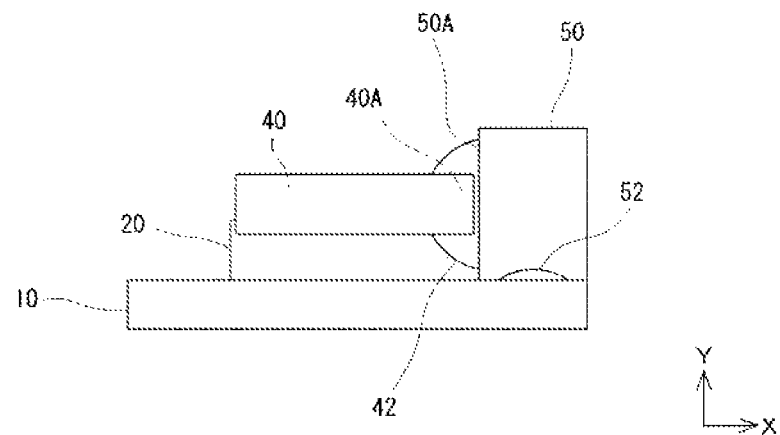
FIG. 3 is a side view of the semiconductor laser module shown in FIG. 1.

FIG. 1 is a plan view showing a semiconductor laser module 1 according to a first embodiment of the present invention, FIG. 2 is a front view thereof, and FIG. 3 is a side view thereof. As shown in FIGS. 1 to 3, the semiconductor laser module 1 of this embodiment has a first substrate 10, a second substrate 20 fixed onto the first substrate 10, a semiconductor laser device (laser diode) 30 mounted on the second substrate 20, a collimator lens 40 for collimating a laser beam emitted from the semiconductor laser device 30, and a lens fixture block 50 fixed onto the first substrate 10 by a block fixation resin 52. In FIG. 1, the semiconductor laser device 30 emits a laser beam L along the Z-direction. The following description assumes that the Y-direction illustrated in FIG. 2 is parallel to a fast axis of the laser beam L.

The collimator lens 40 collimates components of the laser beam L emitted from the semiconductor laser device 30 along a direction of the fast axis (Y-direction) to generate parallel rays. In the present embodiment, as shown in a cross-section of the collimator lens 40 on the YZ-plane in FIG. 2, a surface of the collimator lens 40 into which the laser beam L is incident is in parallel to the Y-axis, and a surface of the collimator lens 40 from which the laser beam is outputted is convex. With such a cross-section, the collimator lens 40 extends along a direction of the slow axis of the laser beam L. (X-direction). For example, the collimator lens 40 has a length of about 2 mm along the X-direction. The collimator lens 40 is aligned to generate desired parallel rays and positioned highly precisely with respect to the Y-direction and the Z-direction.

The lens fixture block 50 is substantially in the form of a rectangular parallelepiped made of, for example, glass or the like. The lens fixture block 50 has a lens attachment surface 50A that is in parallel to an optical axis of the laser beam L. In the present embodiment, the lens attachment surface 50A is also configured to be in parallel to the fast axis (Y-direction) of the laser beam L, i.e., to be perpendicular to the X-direction.

As shown in FIGS. 1 and 3, the lens fixture block 50 is disposed near the second substrate 20 and fixed to an upper surface of the first substrate 10 with the block fixation resin 52. For example, UV-curable resins or thermosetting resins may be used as the block fixation resin 52.

The collimator lens 40 has an end 40A along the X-direction that is fixed to the lens attachment surface 50A of the lens fixture block 50 with a lens fixation resin 42. The collimator lens 40 is held out of contact with the first substrate 10. In other words, the collimator lens 40 is cantilevered by the lens fixture block 50. For example, UV-curable resins or thermosetting resins may be used as the lens fixation resin 42. The lens fixation resin 42 fixes the end 40A of the collimator lens 40 in the X-direction, the Y-direction, and the Z-direction. Preferably, an equal amount of the lens fixation resin 42 is present on opposite sides of the collimator lens 40 along the Z-direction. Furthermore, an equal amount of the lens fixation resin 42 is preferably present on opposite sides of the collimator lens 40 along the Y-direction. Moreover, it is preferable to reduce the thickness of the lens fixation resin 42 between the collimator lens 40 and the lens attachment surface 10A.

The lens fixation resin 42 for fixing the collimator lens 40 is provided between the end 40A of the collimator lens 40 along the X-direction and the lens attachment surface 50A, which perpendicular to the X-direction. Therefore, shrinkage of the lens fixation resin 42 on curing or shrinkage or expansion of the lens fixation resin 42 due to a temperature change or a humidity change primarily causes the position of the collimator lens 40 to vary only in the X-direction, i.e., the direction of the slow axis. Furthermore, reduction in thickness of the lens fixation resin 42 between the collimator lens 40 and the lens attachment surface 50A can reduce the amount of variation of the lens fixation resin 42 per se due to shrinkage or expansion of the lens fixation resin 42. Therefore, the collimator lens 40 hardly changes its position in the Y-direction or the Z-direction. Accordingly, the collimator lens 40 can be held in a highly precisely aligned state.

In the example shown in FIGS. 1 to 3, the entire end surface of the end 40A of the collimator lens 40 along the X-direction is fixed to the lens attachment surface 50A with the lens fixation resin 42. Nevertheless, at least part of the end surface of the end 40A of the collimator lens 40 along the X-direction may be fixed to the lens attachment surface 50A with the lens fixation resin 42.

Furthermore, when an equal amount of the lens fixation resin 42 is present on opposite sides of the collimator lens 40 along the Z-direction, the lens fixation resin 42 equally shrinks or expands on the opposite sides of the collimator lens 40 so that the shrinkage or expansion is cancelled out on the opposite sides of the collimator lens 40. Accordingly, shrinkage or expansion of the lens fixation resin 42 exerts substantially no influence on the collimator lens 40 along the Z-direction. Moreover, when an equal amount of the lens fixation resin 42 is present on opposite sides of the collimator lens 40 along the Y-direction, the lens fixation resin 42 equally shrinks or expands on the opposite sides of the collimator lens 40 so that the shrinkage or expansion is cancelled out on the opposite sides of the collimator lens 40. Accordingly, shrinkage or expansion of the lens fixation resin 42 exerts substantially no influence on the collimator lens 40 along the Y-direction.

Figure 4:
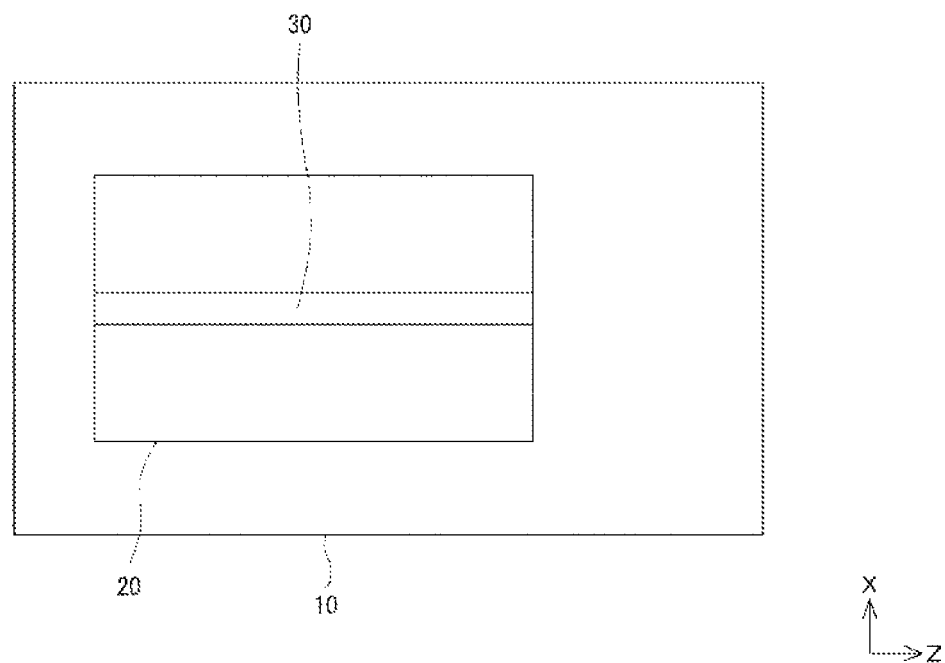
FIG. 4 is a diagram explanatory of a method of manufacturing the semiconductor laser module shown in FIG. 1.
Figure 5:
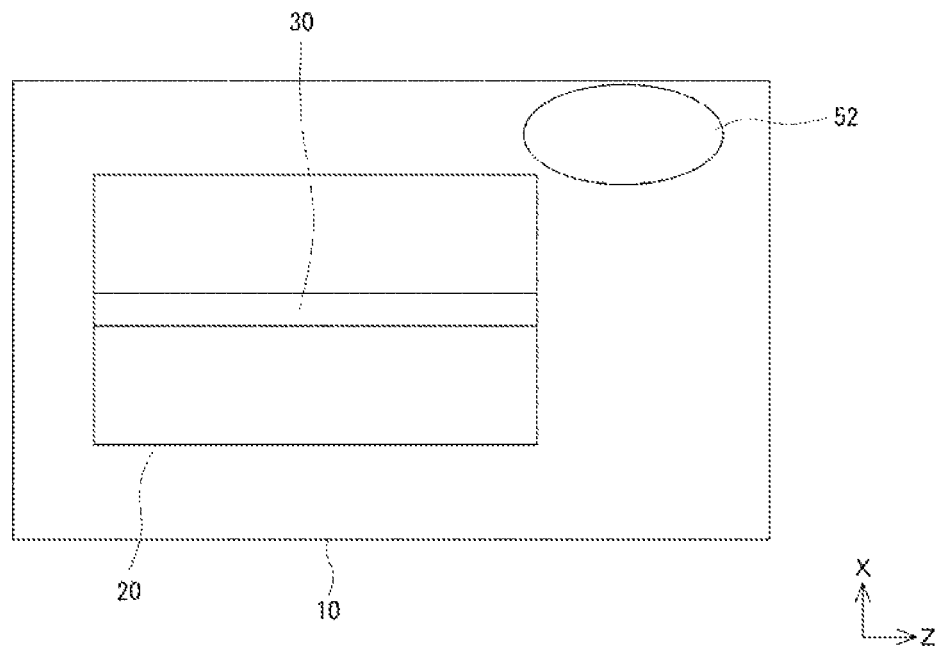
FIG. 5 is a diagram explanatory of a method of manufacturing the semiconductor laser module shown in FIG. 1.

Now a method of manufacturing a semiconductor laser module 1 according to the present invention will be described. When a semiconductor laser module 1 is to be manufactured, a second substrate 20 having a semiconductor laser device 30 mounted thereon is first fixed onto a first substrate 10 (FIG. 4).

Figure 6:
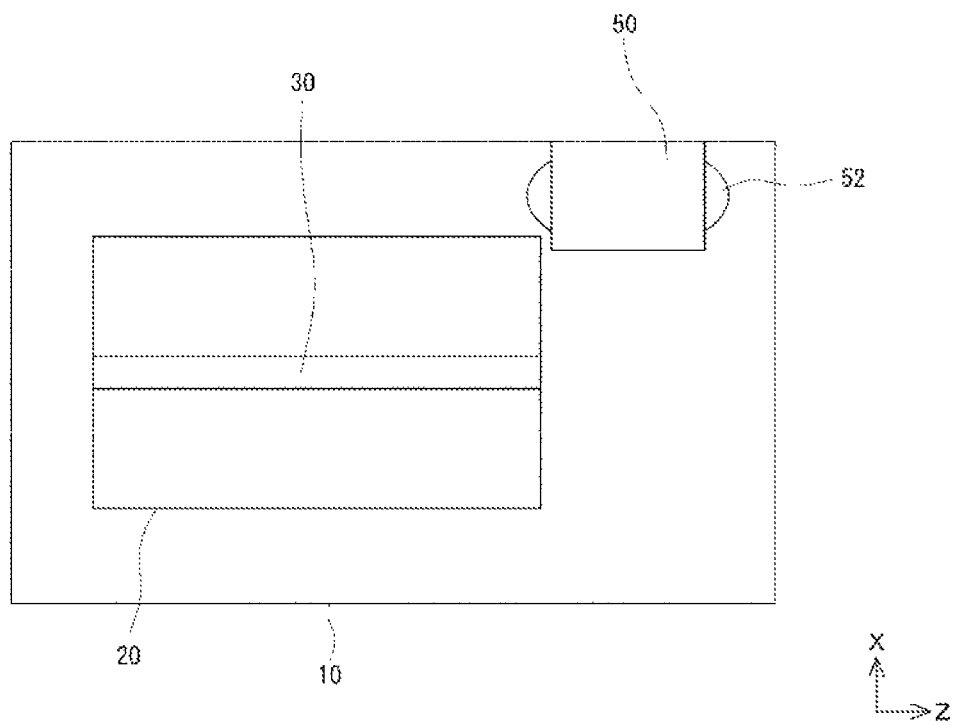
FIG. 6 is a diagram explanatory of a method of manufacturing the semiconductor laser module shown in FIG. 1.

Then a block fixation resin 52 is applied to a certain region on the first substrate 10 5), and a lens fixture block 50 is placed on the block fixation resin 52 (FIG. 6). Thereafter, a lens fixture block 50 is pressed against the first substrate 10 such that the thickness of the block fixation resin 52 between the lens fixture block 50 and the first substrate 10 is as small as possible. At the same time, the block fixation resin 52 is hardened to fix the lens fixture block 50 to the first substrate 10. At that time, the lens fixture block 50 has a lens attachment surface 50A that is perpendicular to the X-direction.

Figure 7:
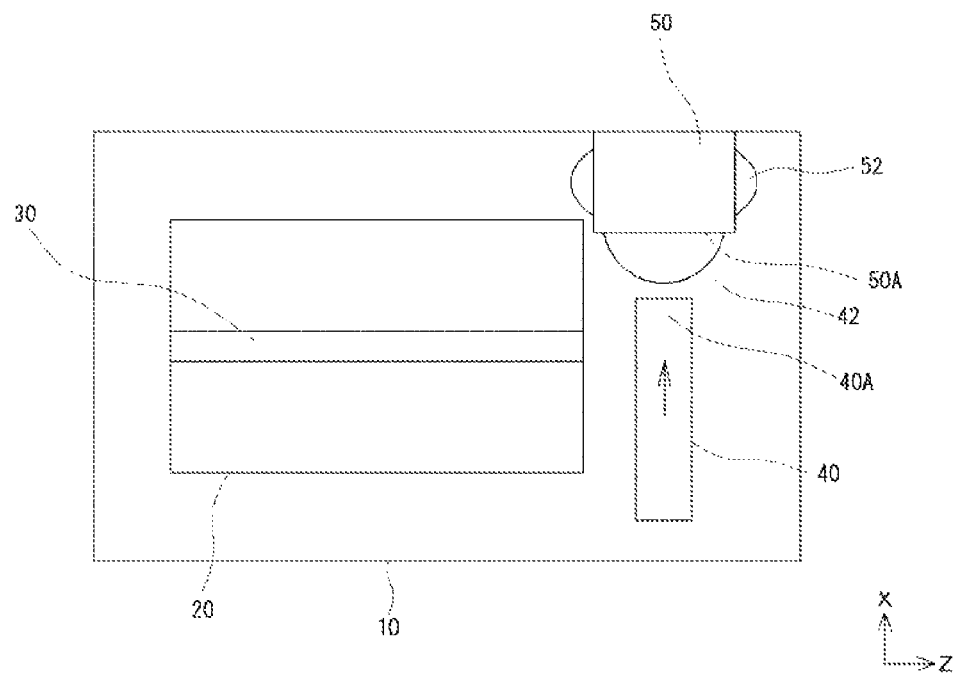
FIG. 7 is a diagram explanatory of a method of manufacturing the semiconductor laser module shown in FIG. 1.

Next, a lens fixation resin 42 is applied to the lens attachment surface 50A of the lens fixture block 50. An end 40A of a collimator lens 40 along the X-direction is inserted into the lens fixation resin 42 in the X-direction (FIG. 7).

Subsequently, a laser beam is emitted from the semiconductor laser device 30. In that state, the collimator lens 40 is moved and positioned in place (active alignment). At that time, it is preferable to minimize the thickness of the lens fixation resin 42 between the collimator lens 40 and the lens attachment surface 50A. While the collimator lens 40 has been positioned in place with high precision, the lens fixation resin 42 is hardened to fix the collimator lens 40 to the lens fixture block 50. In this manner, a semiconductor laser module 1 is completed (FIG. 1).

As described above, according to a method of manufacturing a semiconductor laser module 1 in the present embodiment, the collimator lens 40 is fixed to the lens fixture block 50 with the lens fixation resin 42. Therefore, this method does not require to hold an atmosphere at a high temperature, unlike solder jointing disclosed in Patent Literature 2. Accordingly the collimator lens 40 can be positioned in place while a laser beam is emitted from the semiconductor laser device 30 (active alignment).

Furthermore, the end 40A of the collimator lens 40 along the X-direction is fixed to the lens attachment surface 50A, which is perpendicular to the X-direction. Therefore, shrinkage of the lens fixation resin 42 on curing or shrinkage or expansion of the lens fixation resin 42 due to a temperature change or a humidity change hardly causes the collimator lens 40 to change its position in the Y-direction or the Z-direction. Additionally reduction in thickness of the lens fixation resin 42 between the collimator lens 40 and the lens attachment surface 50A can reduce the amount of variation of the lens fixation resin 42 per se due to shrinkage or expansion of the lens fixation resin 42. Accordingly the collimator lens 40 can be held in a highly precisely aligned state.

It is preferable to fix the lens fixture block 50 such that the thickness of the block fixation resin 52 between the lens fixture block 50 and the first substrate 10 is not more than 20 μm. If the thickness of the block fixation resin 52 between the lens fixture block 50 and the first substrate 10 is more than 20 μm, then the lens fixture block 50 and the collimator lens 40 fixed to the lens fixture block 50 are moved in the Y-direction (direction of the fast axis) because of shrinkage or expansion of the block fixation resin 52 due to a temperature change or a humidity change. In such a case, an optical path of the laser beam emitted from the collimator lens 40 is deviated so as to cause some adverse influence.

Figure 8:
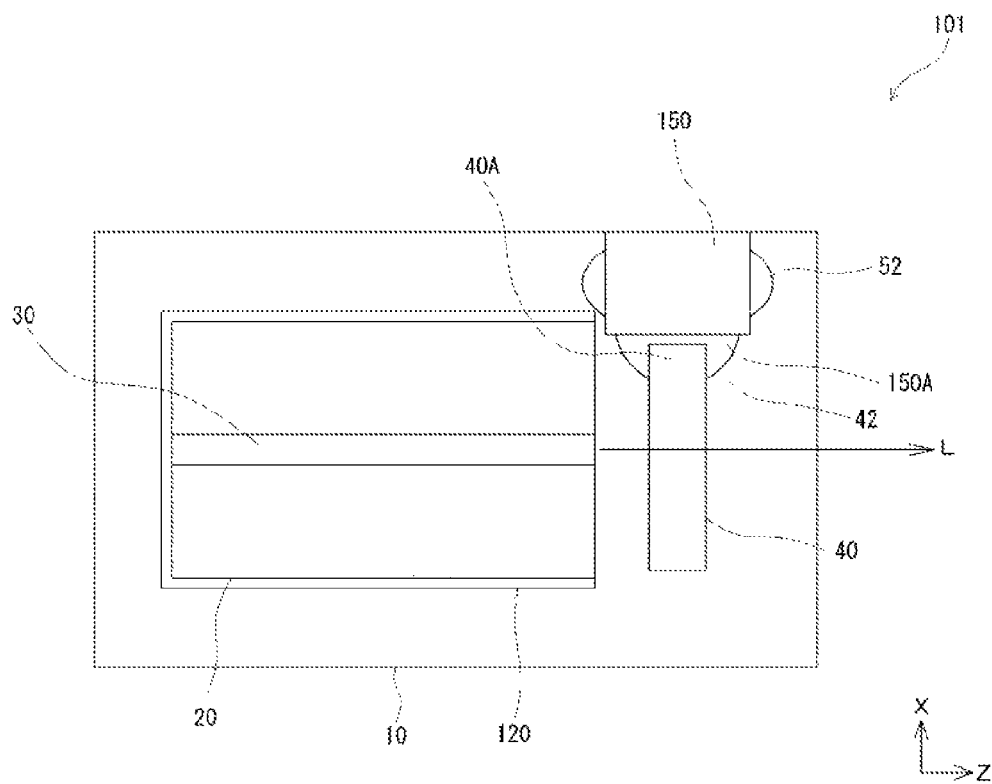
FIG. 8 is a plan view showing a semiconductor laser module according to a second embodiment of the present invention.
Figure 9:
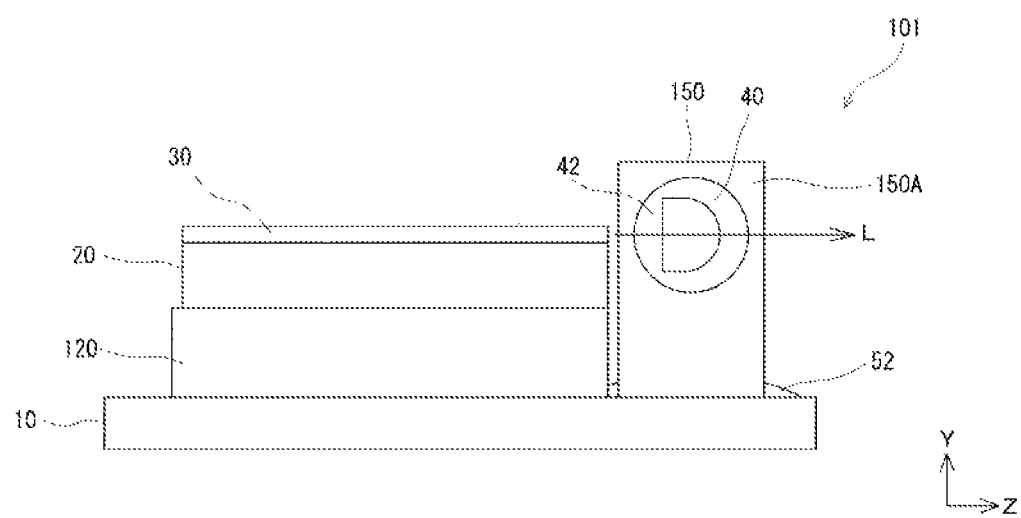
FIG. 9 is a front view of the semiconductor laser module shown in FIG. 8.

FIG. 8 is a plan view showing a semiconductor laser module 101 according to a second embodiment of the present invention, and FIG. 9 is a front view of the semiconductor laser module 101. As shown in FIGS. 8 and 9, the semiconductor laser module 101 of the present embodiment has a third substrate 120 as a spacer between a first substrate 10 and a second substrate 20. Thus, since the spacer 120 having an appropriate thickness is provided between the first substrate 10 and the second substrate 20, a semiconductor laser device 30 can be located at a desired height.

Furthermore, the semiconductor laser module 101 of the present embodiment has a lens fixture block 150 that is substantially in the form of a rectangular parallelepiped made of, for example, glass or the like. This lens fixture block 150 has a lens attachment surface 150A that is perpendicular to the X-direction. The collimator lens 40 has an end 40A along the X-direction that is fixed to the lens attachment surface 150A with a lens fixation resin 42.

In the above embodiments, the lens fixture block 50 may be fixed to a member other than the first substrate 10 as long as it is provided in a fixed relationship with the semiconductor laser device 30. Nevertheless, it is preferable to fix the lens fixture block 50 to the same substrate (the first substrate 10) as a substrate to which the semiconductor laser device 30 is fixed, as with the first and second embodiments.

Furthermore, the above embodiments describe a configuration of fixing only one of ends of the collimator lens 40 along the X-direction. However, a similar lens fixture block 50 may be provided for another end of the collimator lens 40 so as to fix both of the ends of the collimator lens 40 along the X-direction.

Moreover, the collimator lens 40 in the above embodiments collimates components of the laser beam L along the direction of the fast axis (Y-direction). The present invention is also applicable to use of a lens for collimating components of the laser beam L along the direction of the slow axis (X-direction). In such a case, the lens attachment surface of the lens fixture block is arranged in parallel to the XZ-plane, and an end of the collimator lens along the Y-direction is fixed to the lens attachment surface.

Although some preferred embodiments of the present invention have been described, the present invention is not limited to the aforementioned embodiments. It should be understood that various different forms may be applied to the present invention within the technical idea thereof.

INDUSTRIAL APPLICABILITY

The present invention is suitable for use in a semiconductor laser module including a semiconductor laser device and a collimator lens for collimating a laser beam emitted from the semiconductor laser device.

DESCRIPTION OF REFERENCE NUMERALS AND SIGNS

L laser beam
1 semiconductor laser module
10 first substrate
20 second substrate
30 semiconductor laser device
40 collimator lens
40A end
42 lens fixation resin
50 lens fixture block
50A lens attachment surface
52 block fixation resin
120 third substrate (spacer)
150 lens fixture block
150A lens attachment surface

The invention claimed is:

1. A semiconductor laser module comprising:
a semiconductor laser device operable to emit a laser beam having an optical axis along a first direction;
a collimator lens configured to collimate a component of the laser beam emitted from the semiconductor laser device along a second direction perpendicular to the first direction but not to collimate a component of the laser beam along a third direction perpendicular to the first direction and the second direction; and
a lens fixture block having a lens attachment surface perpendicular to the third direction, the lens fixture block being fixed relative to the semiconductor laser device,
wherein at least one of ends of the collimator lens along the third direction is fixed to the lens attachment surface of the lens fixture block with a lens fixation resin.

2. The semiconductor laser module as recited in claim 1, characterized in that the second direction is a direction along a fast axis of the laser beam emitted from the semiconductor laser device.

3. The semiconductor laser module as recited in claim 1, characterized in that the lens fixation resin is a UV-curable resin or a thermosetting resin.

4. The semiconductor laser module as recited in claim 1, characterized in that an equal amount of the lens fixation resin is present on opposite sides of the collimator lens along the first direction, and
an equal amount of lens fixation resin is present on opposite side of the collimator lens along the second direction.

5. The semiconductor laser module as recited in claim 1, characterized in that the semiconductor laser device and the lens fixture block are fixed to the same substrate.

6. The semiconductor laser module as recited in claim 5, characterized in that the lens fixture block is fixed to the substrate with a block fixation resin having a thickness of not more than 20 μm.

7. The semiconductor laser module as recited in claim 5, characterized by further comprising a spacer disposed between the substrate and the semiconductor laser device, the spacer having a predetermined thickness.

8. A method of manufacturing a semiconductor laser module having a semiconductor laser device operable to emit a laser beam having an optical axis along a first direction and a collimator lens configured to collimate a component of the laser beam emitted from the semiconductor laser device along a second direction perpendicular to the first direction but not to collimate a component of the laser beam along a third direction perpendicular to the first direction and the second direction, comprising:
fixing the semiconductor laser device relative to a substrate;
fixing a lens fixture block having a lens attachment surface to the substrate so that the lens attachment surface is perpendicular to the third direction;
applying a lens fixation resin to the lens attachment surface of the lens fixture block;
inserting an end of the collimator lens along the third direction into the lens fixation resin applied to the lens attachment surface;
positioning the collimator lens inserted in the lens fixation resin into a desired location while emitting a laser beam from the fixed semiconductor laser device; and
when the collimator lens has been positioned, hardening the lens fixation resin to fix the collimator lens to the lens fixture block.

9. The method of manufacturing a semiconductor laser module as recited in claim 8, characterized in that the second direction is a direction along a fast axis of the laser beam emitted from the semiconductor laser device.

10. The method of manufacturing a semiconductor laser module as recited in claim 8, characterized in that the end of the collimator lens along the third direction is inserted into the lens fixation resin such that an equal amount of the lens fixation resin is present on opposite sides of the collimator lens along the first direction and that an equal amount of lens fixation resin is present on opposite side of the collimator lens along the second direction.

11. The method of manufacturing a semiconductor laser module as recited in claim 8, characterized in that the fixing the lens fixture block to the substrate comprises:
applying a block fixation resin between the lens fixture block and the substrate, and
hardening the block fixation resin to fix the lens fixture block to the substrate while pressing the lens fixture block against the substrate such that the block fixation resin has a thickness of not more than 20 μm between the lens fixture block and the substrate.

12. The method of manufacturing a semiconductor laser module as recited in claim 8, characterized by disposing a spacer having a predetermined thickness between the substrate and the semiconductor laser device.

* * * * *